(12) United States Patent
Kung et al.

(10) Patent No.: US 11,538,914 B2
(45) Date of Patent: Dec. 27, 2022

(54) SEMICONDUCTOR DEVICE

(71) Applicant: TAIWAN SEMICONDUCTOR MANUFACTURING COMPANY LTD., Hsinchu (TW)

(72) Inventors: Ta-Yuan Kung, New Taipei (TW); Ruey-Hsin Liu, Hsinchu (TW); Chen-Liang Chu, Hsin-Chu (TW); Chih-Wen Yao, Hsinchu (TW); Ming-Ta Lei, Hsin-Chu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 17/224,956

(22) Filed: Apr. 7, 2021

(65) Prior Publication Data
US 2021/0226025 A1 Jul. 22, 2021

Related U.S. Application Data

(63) Continuation of application No. 16/889,781, filed on Jun. 1, 2020, now Pat. No. 10,985,256, which is a
(Continued)

(51) Int. Cl.
*H01L 29/423* (2006.01)
*H01L 29/78* (2006.01)
(Continued)

(52) U.S. Cl.
CPC .... *H01L 29/4236* (2013.01); *H01L 21/76224* (2013.01); *H01L 29/0653* (2013.01); *H01L 29/66666* (2013.01); *H01L 29/7827* (2013.01)

(58) Field of Classification Search
CPC ........... H01L 29/4236; H01L 21/76224; H01L 29/0653; H01L 29/66666; H01L 29/7827;
(Continued)

(56) References Cited

U.S. PATENT DOCUMENTS 8,476,701 B2 * 7/2013 Ueda ................. H01L 29/78
257/334
2010/0140687 A1 * 6/2010 Chu .................... H01L 29/7833
257/E27.026
(Continued)

FOREIGN PATENT DOCUMENTS

CN 101032009 A 9/2007
CN 102376769 A 3/2012
(Continued)

OTHER PUBLICATIONS

Office action issued from TIPO of Taiwan dated Aug. 30, 2021 for counterpart TW108106035.

*Primary Examiner* — Jonathan Han
(74) *Attorney, Agent, or Firm* — WPAT Law; Anthony King

(57) ABSTRACT

A semiconductor device includes a semiconductor substrate, a gate dielectric, a gate electrode, and a pair of source/drain regions. The gate dielectric is disposed in the semiconductor substrate having an upper boundary lower than an upper surface of the semiconductor substrate, and an upper surface flush with the upper surface of the semiconductor substrate. The gate electrode is disposed over the gate dielectric having a first section over the upper boundary of the gate dielectric and a second section over the upper surface of the gate dielectric. The second section partially covers and partially exposes the upper surface of the gate dielectric. The pair of source/drain regions are disposed on opposing sides of the gate dielectric.

20 Claims, 17 Drawing Sheets

Related U.S. Application Data continuation of application No. 15/987,318, filed on May 23, 2018, now Pat. No. 10,686,047.

(51) Int. Cl.
 *H01L 29/66* (2006.01)
 *H01L 21/762* (2006.01)
 *H01L 29/06* (2006.01)

(58) Field of Classification Search
 CPC ........... H01L 21/76229; H01L 29/1045; H01L 29/1087; H01L 29/66621; H01L 29/66659; H01L 29/7834; H01L 29/7835; H01L 27/088; H01L 29/42364; H01L 29/66477; H01L 29/78
 See application file for complete search history.

(56) References Cited

U.S. PATENT DOCUMENTS

| | | | | |
|---|---|---|---|---|
| 2010/0197090 | A1* | 8/2010 | Kim | H01L 29/66621 |
| | | | | 257/E21.642 |
| 2010/0270604 | A1 | 10/2010 | Lin et al. | |
| 2014/0264618 | A1* | 9/2014 | Yu | H01L 21/761 |
| | | | | 438/420 |

FOREIGN PATENT DOCUMENTS

| | | | |
|---|---|---|---|
| CN | 103137624 | A | 6/2013 |
| CN | 103872132 | A | 6/2014 |
| CN | 104143555 | A | 11/2014 |
| JP | 2004158813 | A | 6/2004 |

\* cited by examiner

SEMICONDUCTOR DEVICE

PRIORITY CLAIM AND CROSS-REFERENCE

This application is a continuation of U.S. patent application Ser. No. 16/889,781 filed on Jun. 1, 2020, entitled of "SEMICONDUCTOR DEVICE AND METHOD FOR MANUFACTURING THE SAME", which is a continuation of U.S. patent application Ser. No. 15/987,318 filed on May 23, 2018, entitled of "SEMICONDUCTOR DEVICE AND METHOD FOR MANUFACTURING THE SAME". The entire contents of all of which are hereby incorporated by reference.

BACKGROUND

High-Voltage semiconductor devices such as High-Voltage Metal-Oxide-Semiconductor (HVMOS) devices are commonly used in various electronic devices, such as power management systems, AC/DC converters, input/output (I/O) circuits, etc. The HVMOS devices are designed to sustain high voltages, and thus dimensions and structures of HVMS devices are different from other semiconductor devices such as logic devices formed on the same semiconductor substrate. Due to their different structures and dimensions, integration of HVMOS devices and other semiconductor devices in fabrication faces challenges.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
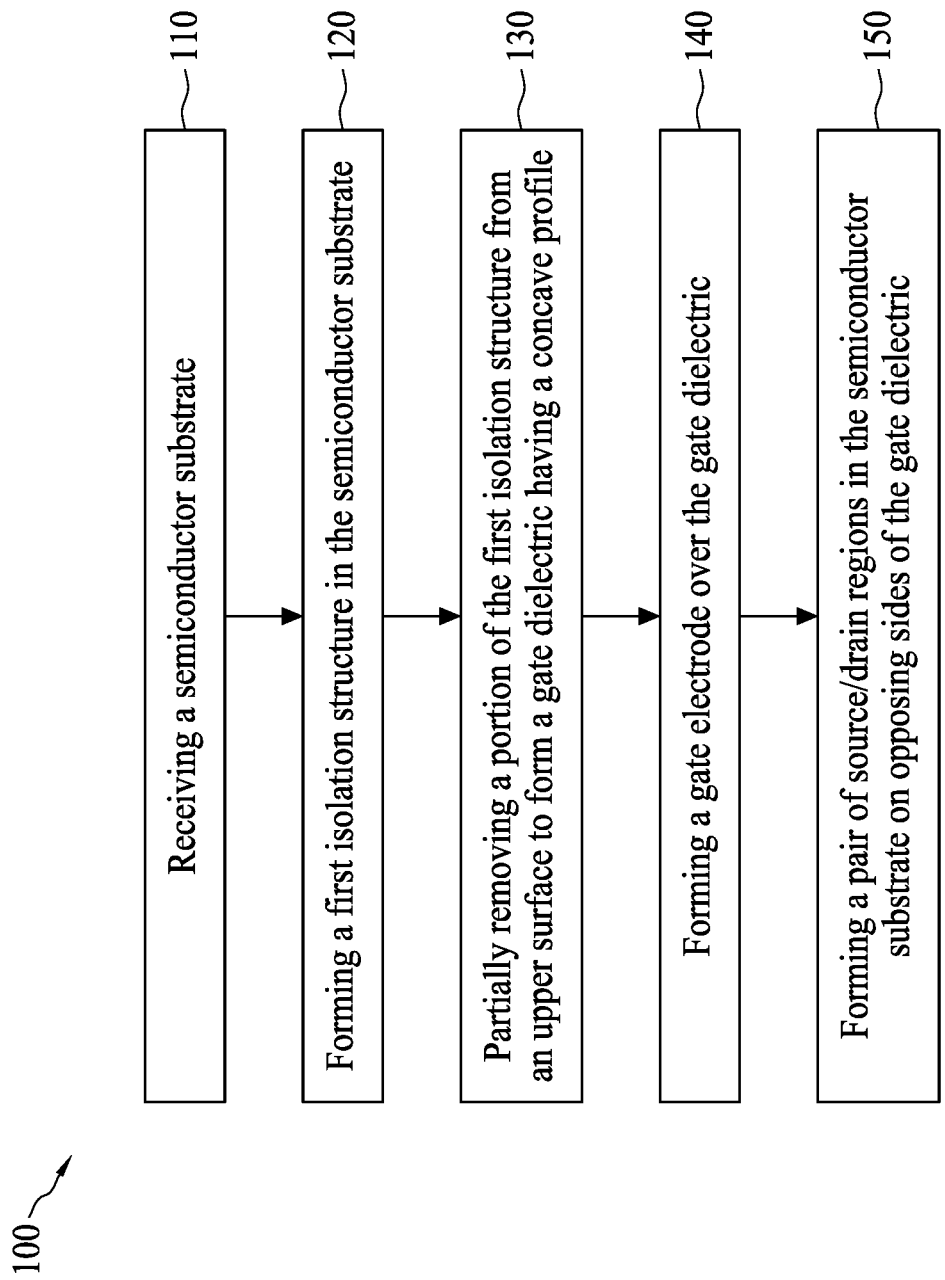
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to +3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to +5°, less than or equal to ±4°, less than or equal to ±3°, less than or equal to ±2°, less than or equal to ±1°, less than or equal to ±0.5°, less than or equal to ±0.1°, or less than or equal to ±0.05°.

In one or more embodiments of the present disclosure, a semiconductor device having a gate dielectric with a concave profile formed in a semiconductor substrate is provided. The concave profile defines an upper boundary with a gate electrode lower than an upper surface of the semiconductor substrate. The concave profile of the gate dielectric allows lowering a gate electrode formed thereon with respect to the upper surface of the semiconductor substrate. Accordingly, the semiconductor device such as HVMOS device with thicker gate dielectric can be integrally formed with other semiconductor devices such as logic MOS device with thinner dielectric. Hence, the manufacturing operations can be simplified, and the production costs can be reduced.

FIG. 1 is a flow chart illustrating a method for manufacturing a semiconductor device according to various aspects of one or more embodiments of the present disclosure. The method 100 begins with operation 110 in which a semiconductor substrate is received. The method 100 proceeds with operation 120 in which a first isolation structure is formed in the semiconductor substrate. The method 100 proceeds with operation 130 in which a portion of the first isolation structure is partially removed from an upper surface to form a gate dielectric having a concave profile. The method 100 continues with operation 140 in which a gate electrode is formed over the gate dielectric. The method proceeds with operation 150 in which a pair of source/drain regions are formed in the semiconductor substrate on opposing sides of the gate dielectric.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
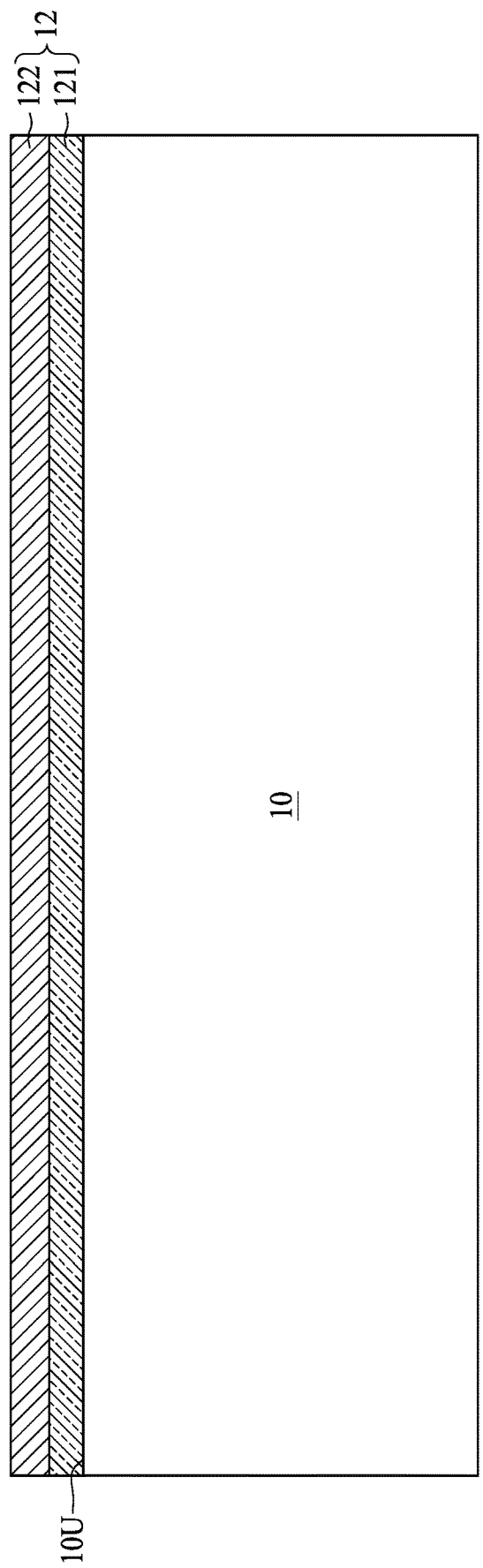
FIG. 2A, FIG. 2B, FIG. 2C, FIG. 2D, FIG. 2E, FIG. 2F, FIG. 2G, FIG. 2H, FIG. 2I, FIG. 2J and FIG. 2K are schematic views at one of various operations of manufacturing a semiconductor device according to one or more embodiments of the present disclosure.

FIG. 2A, FIG. 2B, FIG. 2C, FIG. 2D, FIG. 2E, FIG. 2F, FIG. 2G, FIG. 2H, FIG. 2I, FIG. 2J and FIG. 2K are schematic views at one of various operations of manufacturing a semiconductor device according to one or more embodiments of the present disclosure. As shown in FIG. 2A, a semiconductor substrate 10 is received. The semiconductor substrate 10 may include a bulk substrate or a composite substrate. In some embodiments, the material of the semiconductor substrate 10 may include elementary semiconductive material such as silicon, germanium and/or the like, or compound semiconductor material such as III-V semiconductor material including GaAsP, AlGaAs, GaInP, GaInAsP and/or the like. In some embodiments, the semiconductor substrate 10 may be doped such as of P type, but is not limited thereto. A sacrificial structure 12 is formed over an upper surface 10U of the semiconductor substrate 10. By way of example, the sacrificial structure 12 may include a pad layer 121 and a mask layer 122. The pad layer 121 may include, but is not limited to, a silicon oxide layer, which may be formed by thermal oxidation. The pad layer 121 may be configured as an adhesion layer between semiconductor substrate 10 and the mask layer 122. In some embodiments, the pad layer 121 may also be configured as an etch stop layer. In some embodiments, the mask layer 122 may include a silicon nitride layer, which may be formed by deposition such as low-pressure chemical vapor deposition (LPCVD) or the like. The mask layer 122 is configured as an etch mask for subsequent photolithography operation.

Figure 2B:
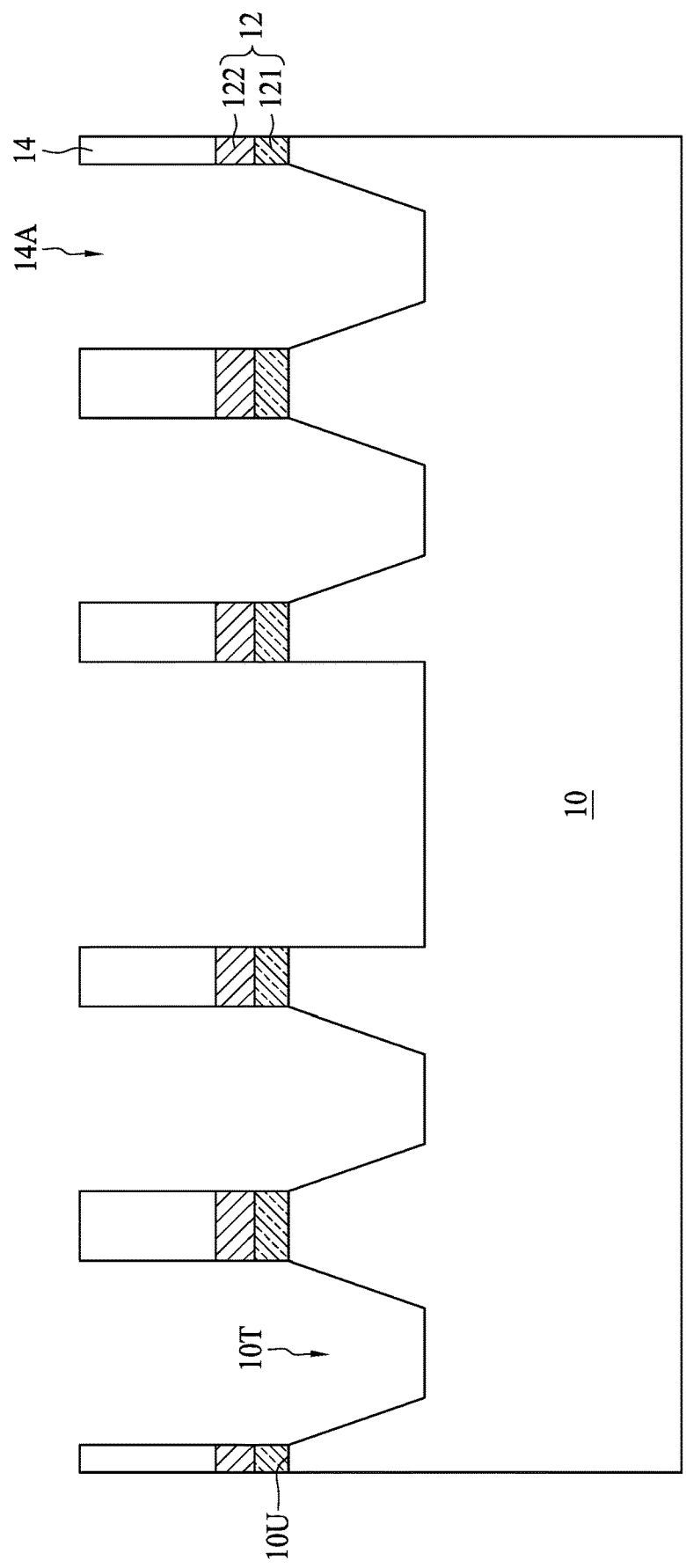

As shown in FIG. 2B, a resist layer 14 is formed over the mask layer 122. The resist layer 14 includes openings 14A partially exposing the mask layer 122. In some embodiments, the resist layer 14 may include a photoresist layer, and can be patterned by exposure and development operations. The mask layer 122 and the pad layer 121 may be etched through the openings 14A, partially exposing the underlying semiconductor substrate 10. The exposed semiconductor substrate 10 is partially removed, by e.g., etching, to form a plurality of trenches 10T. The edge profile of the trenches 10T may be controlled by selecting different etching operations and/or etching parameters. In some embodiments, the trenches 10T may have an inclined edge profile, a vertical edge profile, or a curved edge profile. In FIG. 2B, an inclined edge profile and a vertical edge profile of the trench 10T are drawn in accordance with some embodiments.

Figure 2C:
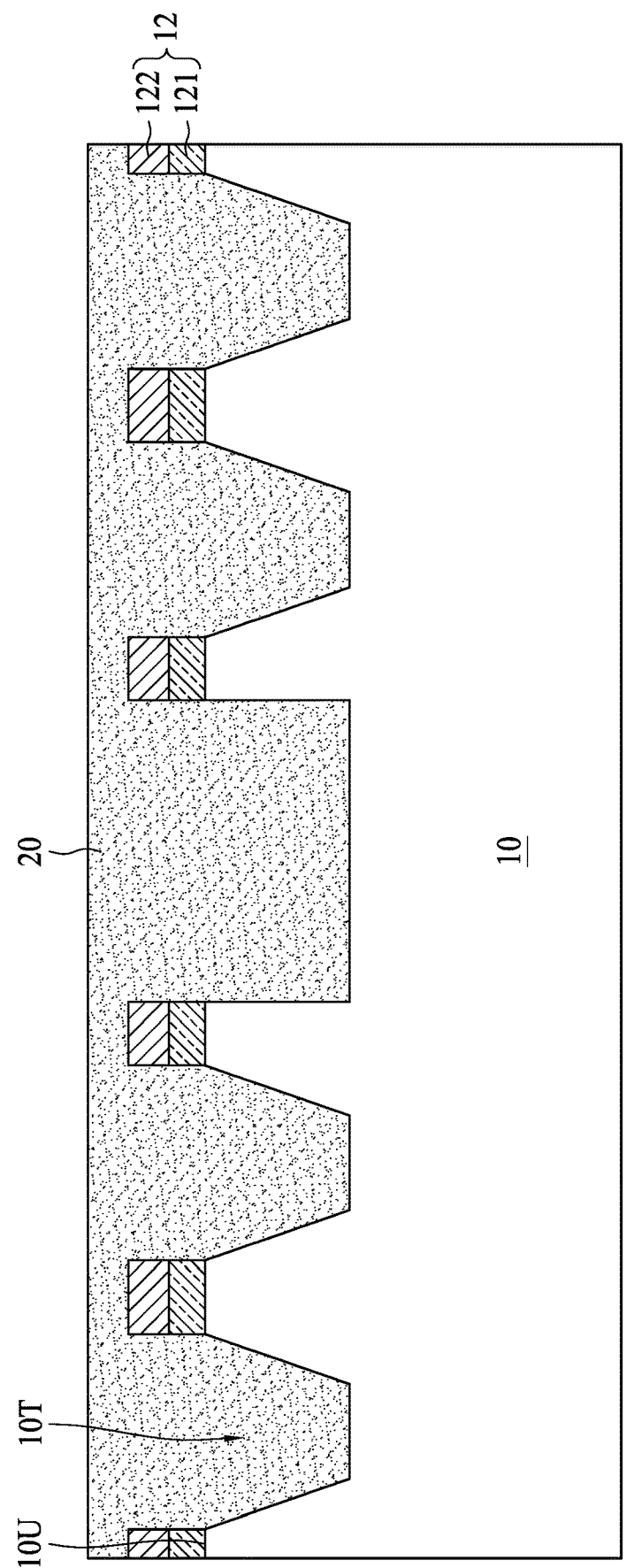

As shown in FIG. 2C, the resist layer 14 may be then removed. An insulative material 20 is formed over the sacrificial structure 12 and in the trenches 10T. In some embodiments, the material of the insulative material 20 may include silicon oxide, silicon nitride, silicon oxynitride or the like. The insulative material 20 may be formed using suitable deposition techniques such as plasma enhanced chemical vapor deposition (PECVD), selective area chemical vapor deposition (SACVD) or the like. In some embodiments, a liner oxide may be formed over the bottoms and the sidewalls of trenches 10T prior to formation of the insulative material 20. In some embodiments, the liner oxide may include a thermal oxide layer formed over the exposed surface of the semiconductor substrate 10 by oxidation, or the like. In some other embodiments, the liner oxide may be formed by deposition such as atomic layer deposition (ALD), or the like.

Figure 2D:
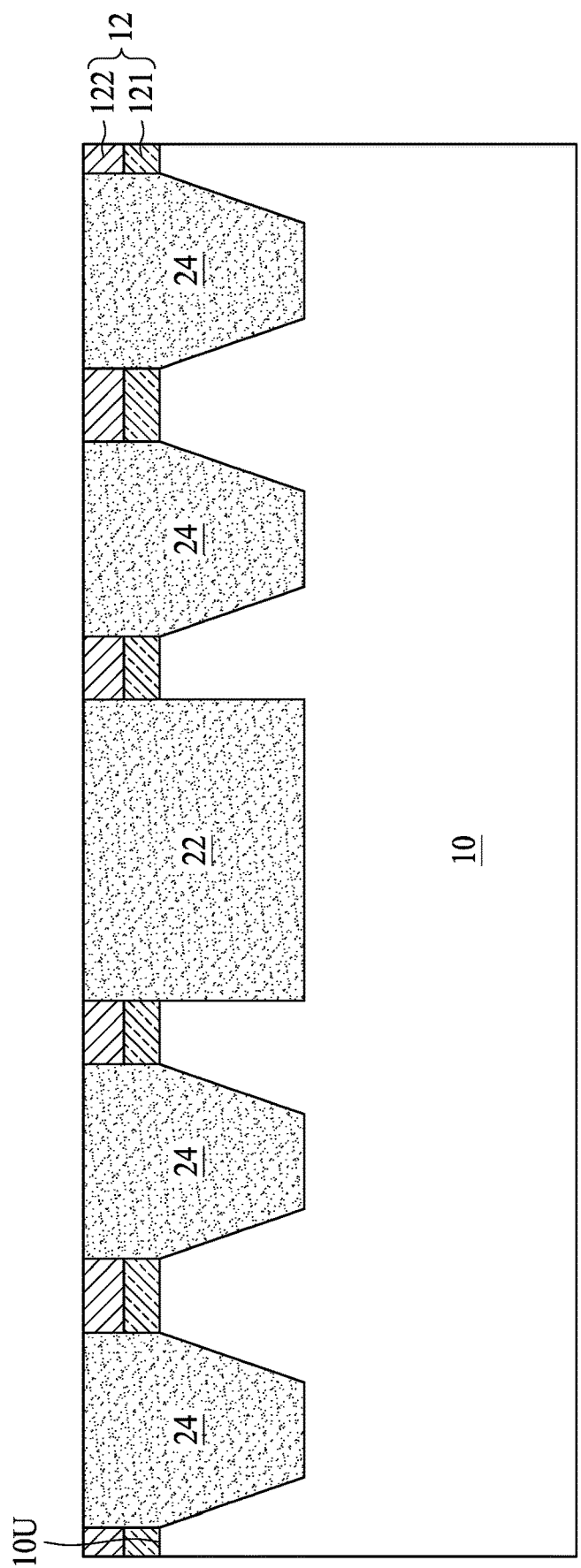

As shown in FIG. 2D, a planarization operation such as a chemical mechanical polishing (CMP) operation may be performed to remove excess portions of the insulative material 20 over the mask layer 122 to form a plurality of isolation structures. In some embodiments, the mask layer 122 may be configured as a CMP stop layer. Among the isolation structures, a first isolation structure 22 may be configured to form a gate dielectric of a semiconductor device, while second isolation structures 24 may be configured as shallow trench isolations (STIs).

Figure 2E:
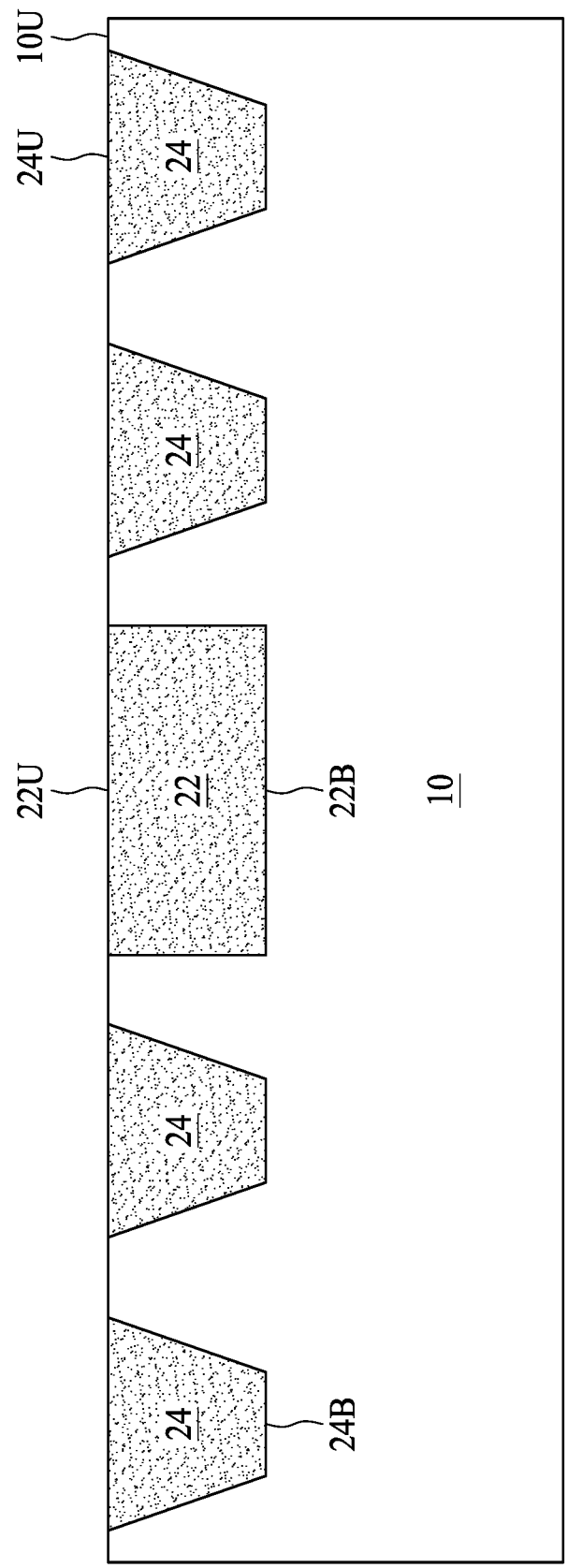

As shown in FIG. 2E, the mash layer 122 and the pad layer 121 are removed from the upper surface 10U of the semiconductor substrate 10. The mask layer 122 and the pad layer 121 may be removed by etching such as wet etching. In some embodiments, a cleaning operation may be performed to clean the upper surface 10U of the semiconductor substrate 10. In some embodiments, the first isolation structure 22 and the second isolation structures 24 are formed concurrently by the same operation, and thus an upper surface 22U of the first isolation structure 22 is substantially flush with upper surfaces 24U of the second isolation structures 24, and a bottom surface 22B of the first isolation structure 22 is substantially flush with bottom surfaces 24B of the second isolation structures 24. In some embodiments, the upper surface 22U of the first isolation structure 22 is, but is not limited to be, substantially flush with the upper surface 10U of the semiconductor substrate 10.

Figure 2F:
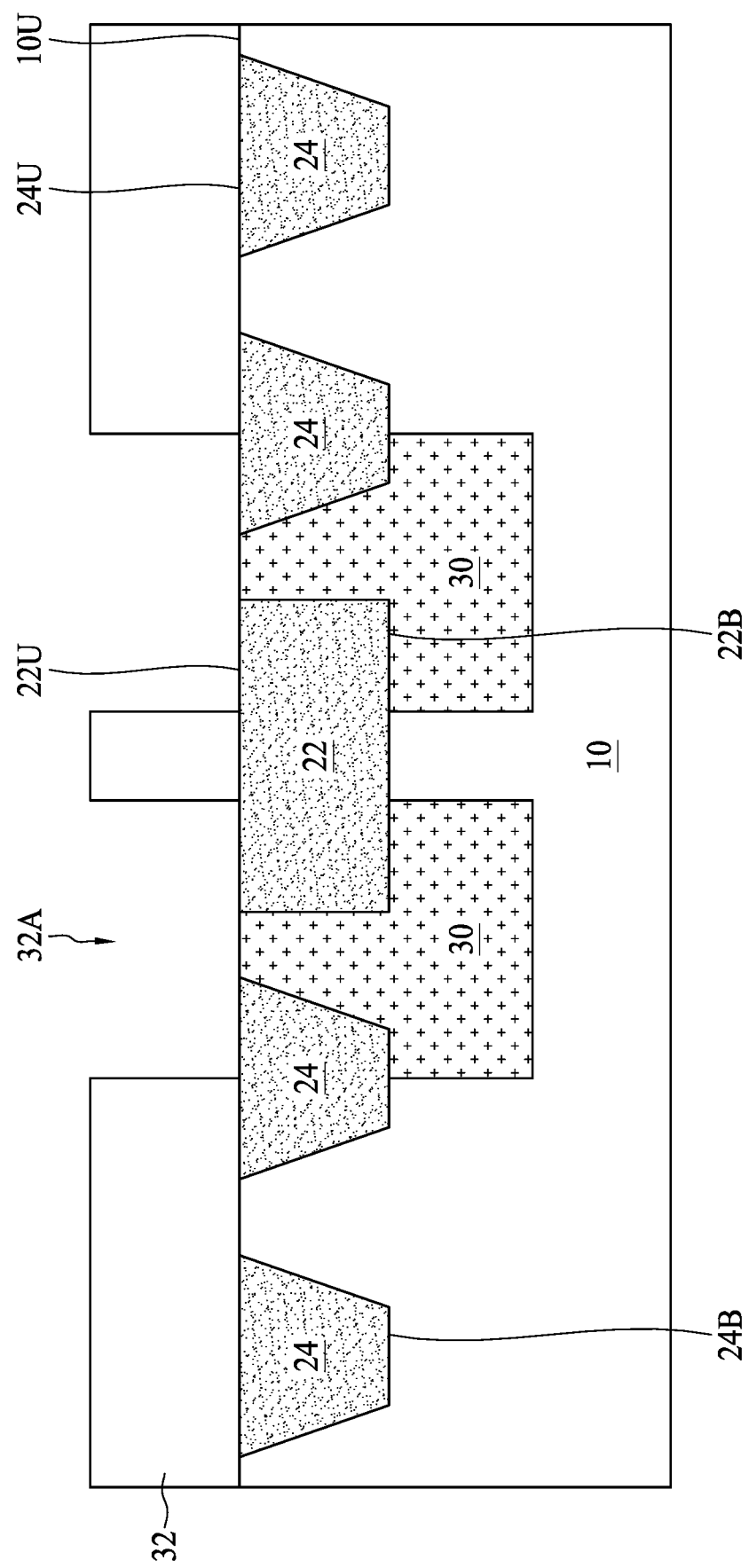

As shown in FIG. 2F, a pair of first well regions 30 are formed in the semiconductor substrate 10. In some embodiments, a resist layer 32 such as a photoresist layer having openings 32A is formed over the semiconductor substrate 10, partially exposing the semiconductor substrate 10. Then, an impurity implantation is performed through the openings 32A to form the pair of first well regions 30 in the semiconductor substrate 10. In some embodiments, a High-Voltage NMOS device is to be fabricated, and the pair of first well regions 30 have N type doping type and are configured as high voltage N well (HVNW). The semiconductor substrate 10 may have an opposite doping type such as type. In some other embodiments, a High-Voltage PMOS device is to be fabricated, and the pair of first well regions 30 have P type doping type and are configured as high voltage P well (HVPW). The semiconductor substrate 10 may have an opposite doping type such as N type.

Figure 2G:
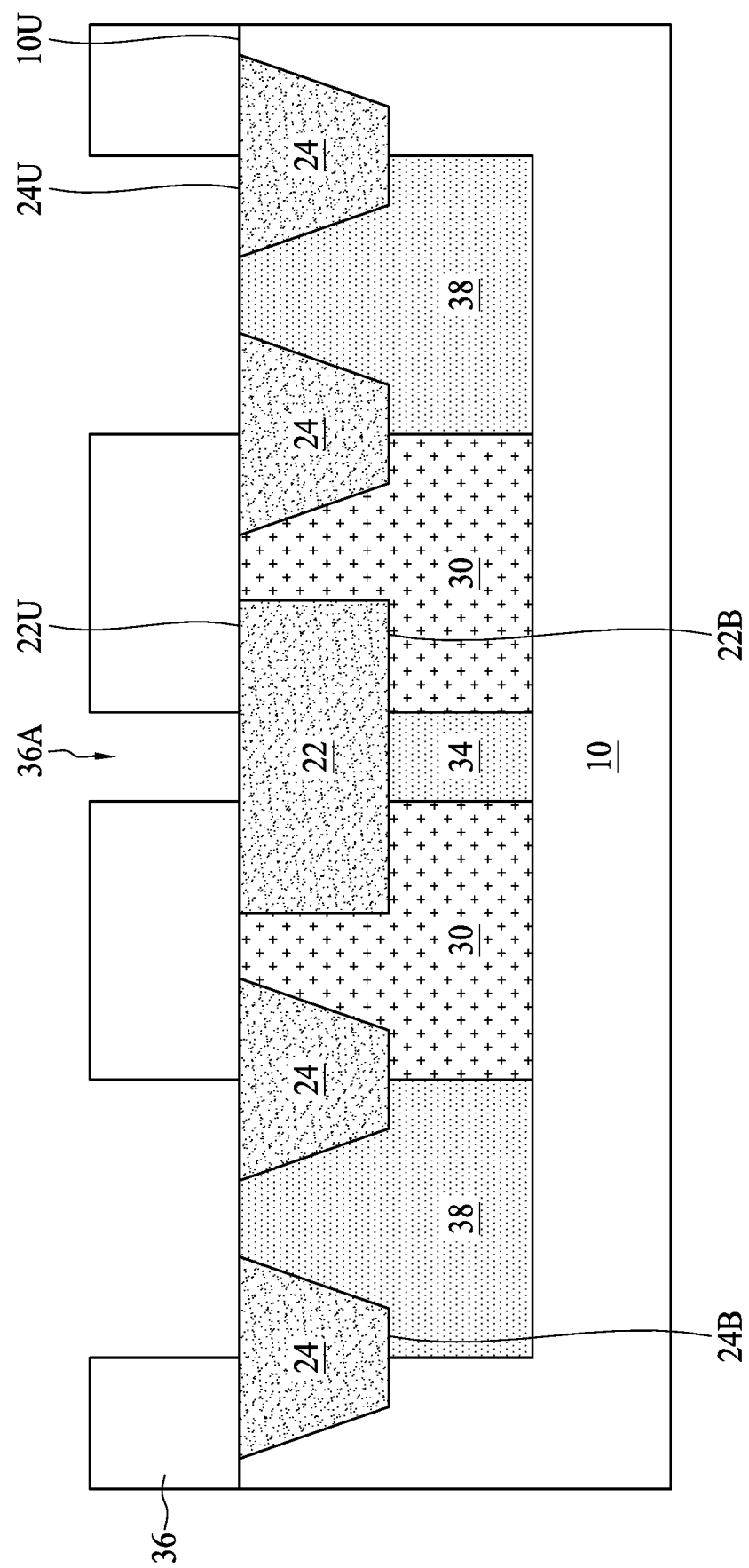

As shown in FIG. 2G, the resist layer 32 is removed. A second well region 34 is formed in the semiconductor substrate 10. In some embodiments, another resist layer 36 such as a photoresist layer having an opening 36A is formed over the semiconductor substrate 10, partially exposing the semiconductor substrate 10. Then, another impurity implantation is performed through the opening 36A to form the second well region 34 in the semiconductor substrate 10. The second well region 34 has a doping type such as P type opposite to that of the pair of first well regions 30, and the second well region 34 is configured as a high voltage P well (HVPW). The second well region 34 is disposed under the first isolation structure 22. The second well region 34 is disposed between the pair of first well regions 30 such that the pair of first well regions 30 are separated by the second well region 34. In some embodiments, the pair of first well regions 30 are arranged symmetrically with respect to the second well region 34. In some embodiments, one or more third well regions 38 may be formed along with the second well region 34. The third well regions 38 may, but are not limited to, have the same doping type and doping concentration as the second well region 34.

Figure 2H:
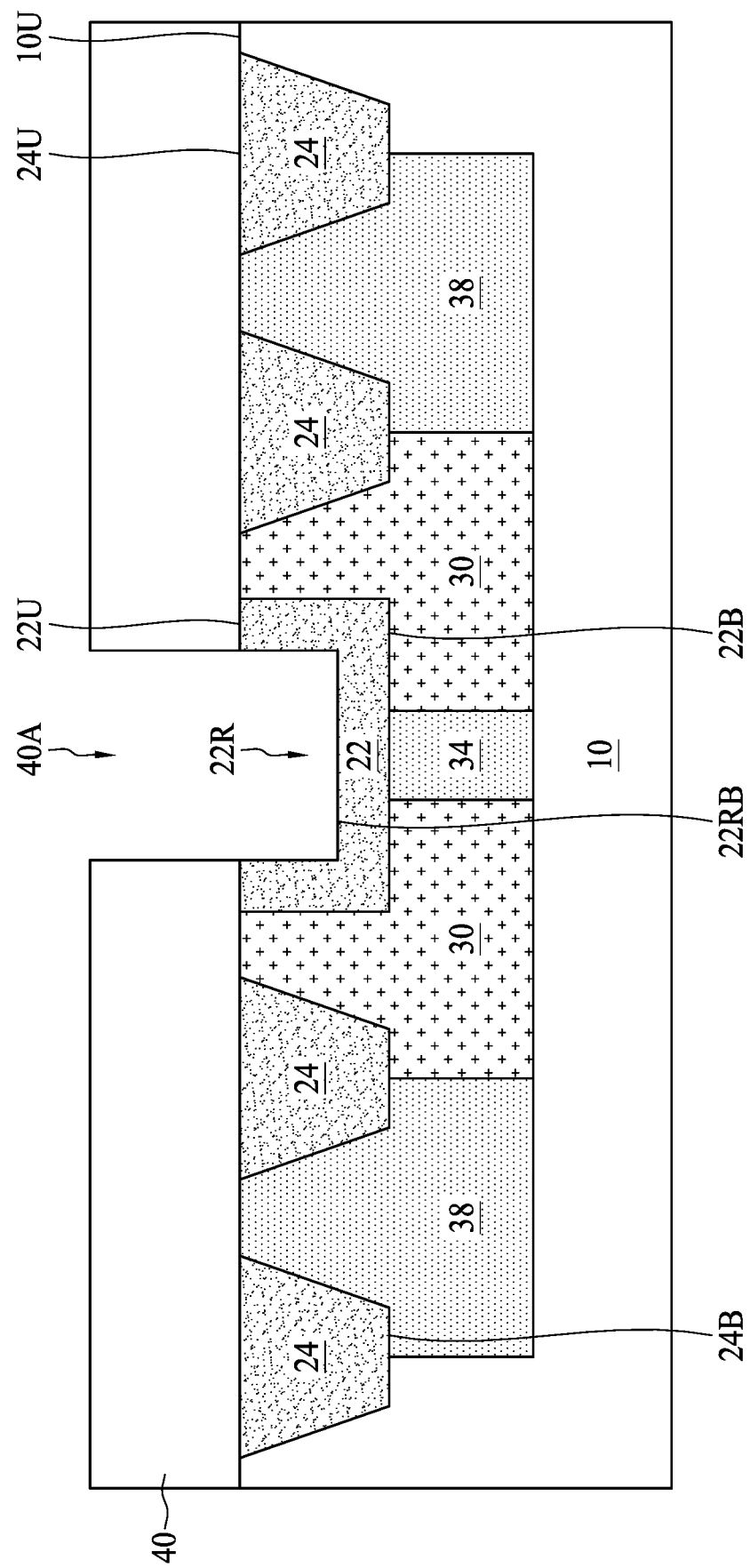

As shown in FIG. 2H, the resist layer 36 is removed. A portion of the first isolation structure 22 is partially removed from the upper surface 22U to form a recess 22R having a bottom 22RB extending into the first isolation structure 22. In some embodiments, the recess 22R may be formed by photolithography operation. By way of example, a resist layer 40 is formed over the semiconductor substrate 10, with an opening 40A partially exposing the first isolation structure 22. An etching operation is then performed to etch the first isolation structure 22 to form the recess 22R.

Figure 2I:
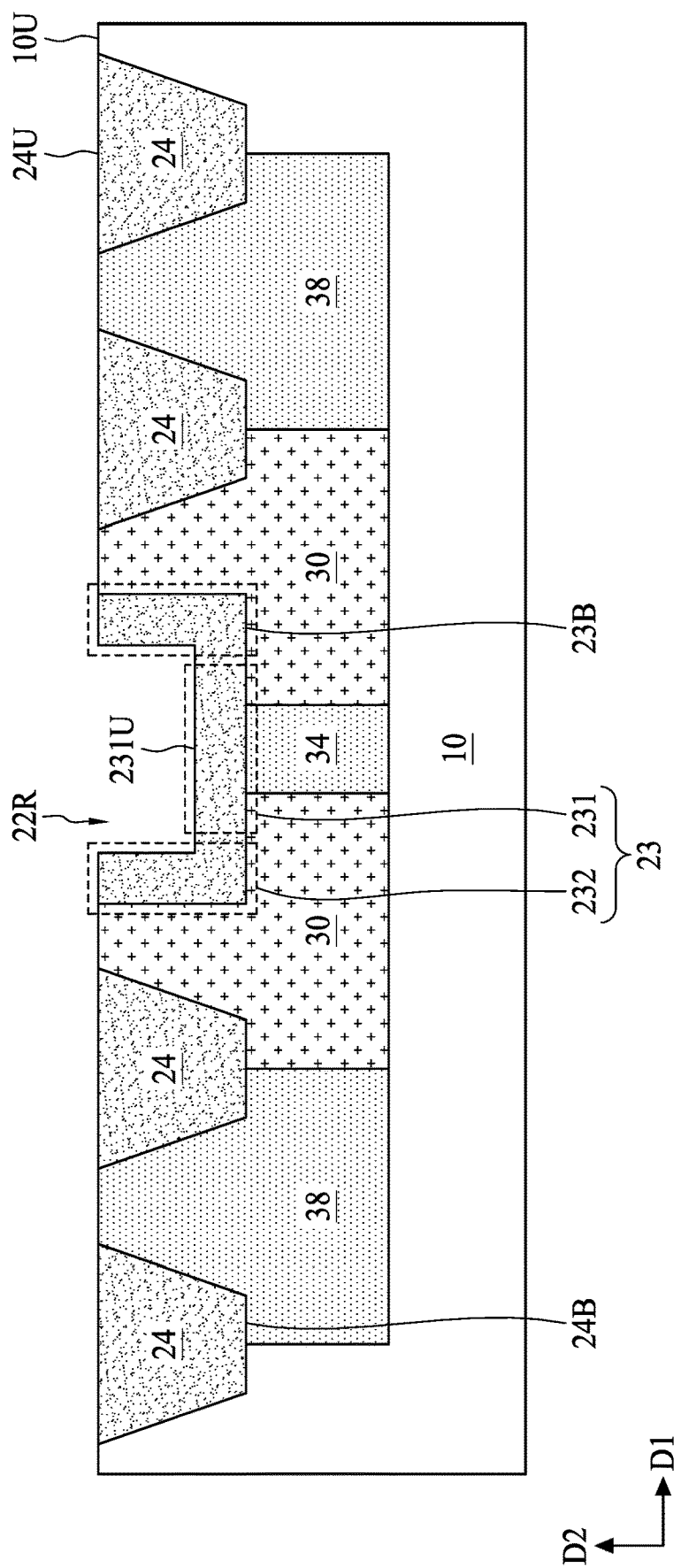

As shown in FIG. 2I, the resist layer 40 is removed, and the first isolation structure 22 may form a gate dielectric 23 with a concave profile. In some embodiments, a depth of the gate dielectric 23 (e.g., as indicated by the bottom interface 23B) is substantially the same with that of the second isolation structures 24 (e.g., as indicated by bottom interface 24B). In some embodiments, the gate dielectric 23 may include a first portion 231, and a second portion 232. The first portion 231 is disposed in the bottom of the recess 22R, and extends along a first direction D1. The second portion 232 is connected to the first portion 231, and extends along a second direction D2. The first portion 231 and the second portion 232 cooperatively form the concave profile, such that the upper boundary 231U of the first portion 231 is lower than the upper surface 10U of the semiconductor substrate 10. By way of example, the first direction D1 is substantially a lateral direction, and the second direction D2 is substantially a vertical direction. In some other embodiments, the second direction D2 may be a direction inclined with respect to the first direction D1.

The thickness of the gate dielectric 23 may be configured based on different requirements for different semiconductor devices. For example, when the gate dielectric 23 is used in HVMOS device, the thickness of the gate dielectric 23 e.g., the thickness of the first portion 231 is substantially ranging from about 800 angstroms to about 1200 angstroms. The depth of the recess 22R may be decided based on the thickness of the first isolation structure 22, the thickness of the gate dielectric 23 and the thickness of the gate electrode to be formed. For example, the depth of the recess 22R is such selected that the thickness of the gate dielectric 23 can meet the voltage-sustaining requirement for HVMOS device. The thickness of the gate electrode to be formed is also considered to decide the depth of the recess 22R such that a height difference between the upper surface of the gate electrode and the upper surface 10U of the semiconductor substrate 10 can be controlled.

Figure 2J:
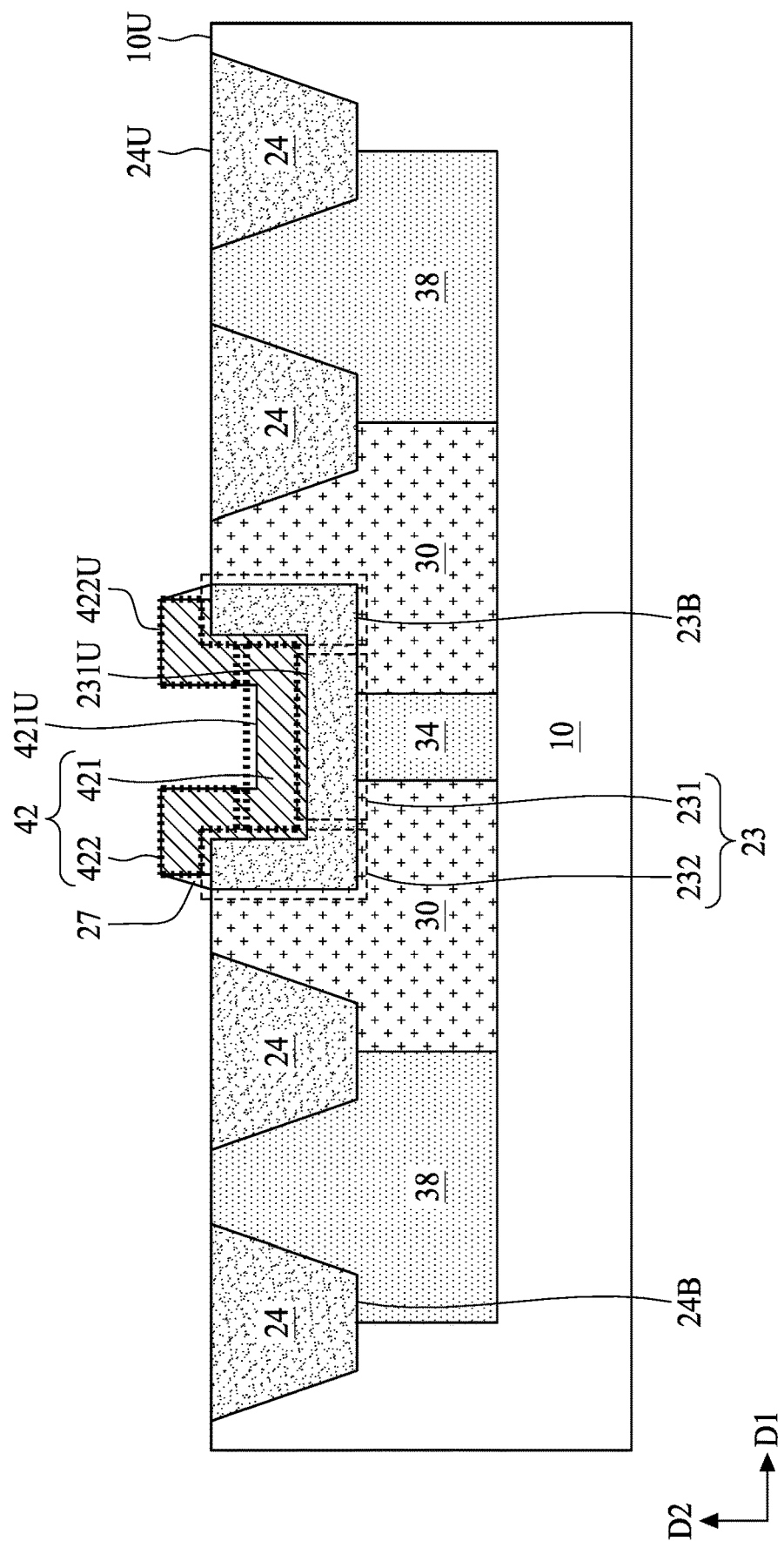

As shown in FIG. 2J, a gate electrode 42 is formed over the gate dielectric 23. The gate electrode 42 is formed from conductive material(s) such as doped semiconductive material e.g., doped polycrystalline silicon, or other suitable conductive materials e.g., metal. In some embodiments, the gate electrode 42 may have a concave profile. For example, the gate electrode 42 may include a first section 421, and a second section 422 connected to the first section 421. The first section 421 may be disposed over the first portion 231, and the second section 422 may be extending along the second portion 232. In some embodiments, the upper surface 421U of the first section 421 is lower than the upper surface 10U of the semiconductor substrate 10, while the upper surface 422U of the second section 422 may be higher than, lower than or equal to the upper surface 10U of the semiconductor substrate 10. In some other embodiments, the upper surface 421U of the first section 421 may be higher than or substantially flush with the upper surface 10U of the semiconductor substrate 10. In some embodiments, spacers 27 may be formed on opposing sides of the gate electrode 23.

In some embodiments, the gate electrode 42 abuts the first portion 231 and the second portion 232 of the gate dielectric 23. The thickness of the gate electrode 42 may be configured based on different requirements for different devices. For example, the thickness of the gate electrode 42 e.g., the thickness of the first section 421 is substantially ranging from about 600 angstroms to about 1200 angstroms.

Figure 2K:
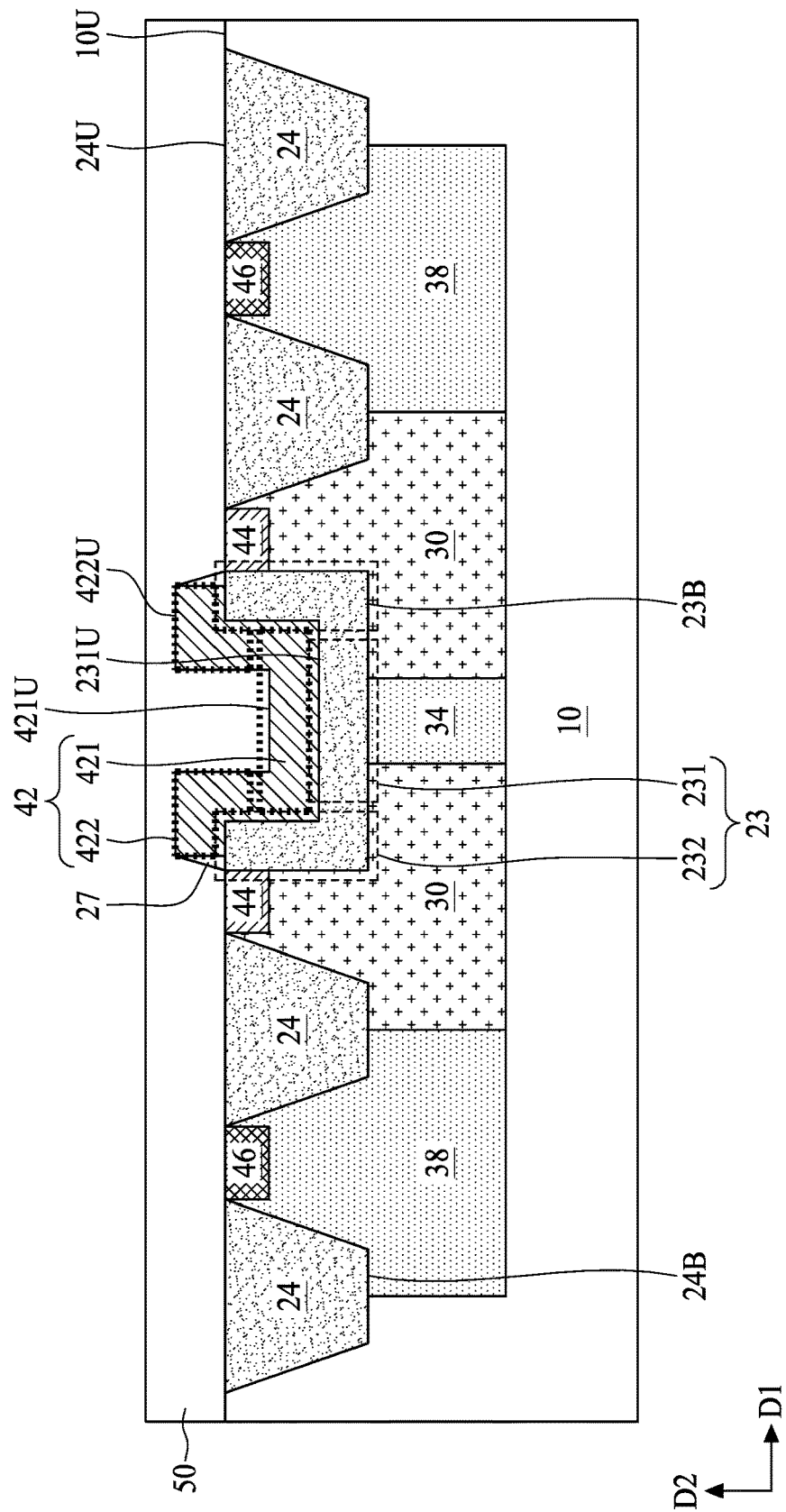

As shown in FIG. 2K, a pair of source/drain regions 44 are formed in the semiconductor substrate 10 on opposing sides of the gate dielectric 23. The pair of source/drain regions 44 are disposed over and electrically connected to the pair of first well regions 30, respectively. In some embodiments, the doping type of the pair of source/drain regions 44 is the same as that of the pair of first well regions 30, and the doping concentration of the pair of source/drain regions 44 is higher than that of the pair of first well regions 30. In some embodiments, one or more contact regions 46 may be formed in the semiconductor substrate 10, and electrically connected to the third well regions 38, respectively. In some embodiments, the doping type of the pair of contact regions 46 is the same as that of the third well regions 38, and the doping concentration of the contact regions 46 is higher than that of the third well regions 38. In some embodiments, the contact regions 46 may be configured to provide voltage to the semiconductor substrate 10 through the third well regions 38.

In some embodiments, an inter-layer dielectric (ILD) is formed over the semiconductor substrate 10, covering the gate electrode 42. Accordingly, a semiconductor device 1 is formed. In some embodiments, the thickness of gate dielectric 23 may have a range from about 800 angstroms to about 1200 angstroms, and the thickness of gate electrode 42 ranges from about 600 angstroms to about 1200 angstroms. The thickness of the ILD 50 may be smaller than a sum of the thickness of the gate dielectric 23 and the thickness of the gate electrode 42. For example, the thickness of the ILD 50 may be about 1300 angstroms. By virtue of the concave profile of the gate dielectric 23, the ILD 50 may cover the gate electrode 42.

In some embodiments, the semiconductor device 1 is a symmetric NMOS device. The semiconductor substrate 10 may be a P type substrate. The first well regions 30 may be N type. The second well region 34 and the third well regions 38 may be P type.

Figure 3:
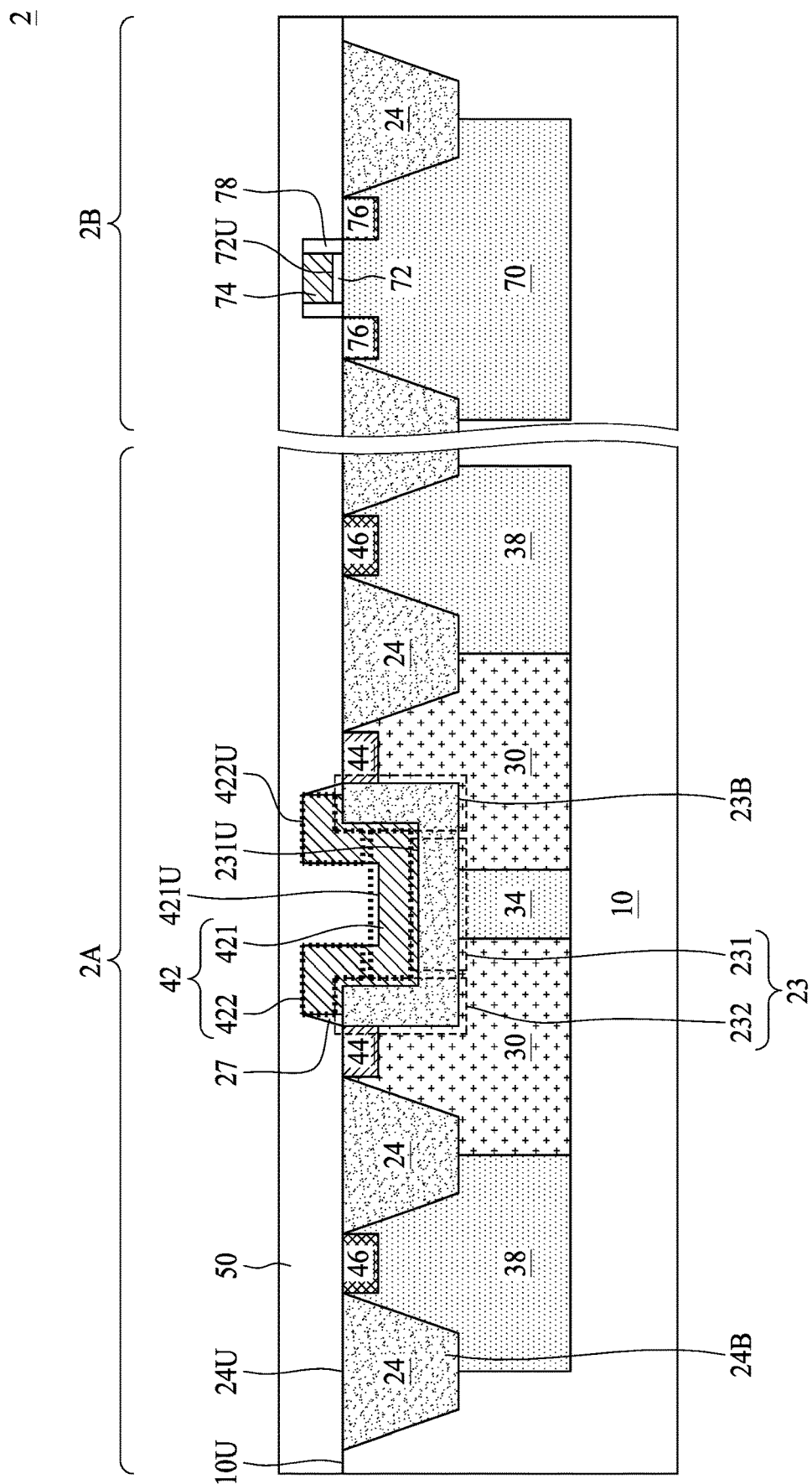
FIG. 3 is a schematic view of a semiconductor device according to some embodiments of the present disclosure.

Refer to FIG. 3. FIG. 3 is a schematic view of a semiconductor device according to some embodiments of the present disclosure. As shown in FIG. 3, the semiconductor device 2 may include a first semiconductor device 2A and a second semiconductor device 2B integrally formed over the semiconductor substrate 10. In some embodiments, the first semiconductor device 2A may be a HVMOS device such as the semiconductor device 1 as illustrated in FIG. 2K, and details of the first semiconductor device 2A are described. In some other embodiments, the first semiconductor device 2A may be the semiconductor device 3, 4, 5 or 6 as illustrated in other embodiments of the present disclosure. The second semiconductor device 2B may be a logic device, a medium voltage MOS (MVMOS) device, a low voltage MOS (LVMOS) device or the like. The second semiconductor device 213 may include a well 70, a second gate dielectric 72, a second gate electrode 74, a pair of second source/drain regions 76, and second spacers 78. The second gate dielectric 72 is over the semiconductor substrate 10. In contrast to the gate dielectric 23 of the first semiconductor device 2A, the second gate dielectric 72 is thinner, and may be formed over a planar portion of the semiconductor substrate 10. The second gate dielectric 72 has a second upper boundary 72U higher than the upper surface 10U of the semiconductor substrate 10. The second gate electrode 74 is disposed over the second gate dielectric 72. The pair of second source/drain regions 76 are disposed in the semiconductor substrate 10 on opposing sides of the second gate dielectric 72. In some embodiments, the second semiconductor device 2B may further include second spacers 78 on opposing sides of the second gate electrode 74. The semiconductor device 2 further includes an ILD 50 covering the gate electrode 42 and the second gate electrode 74.

For the HVMOS device such as the first semiconductor device 2A, the gate dielectric 23 often employs a thicker thickness to sustain high voltage. The thicker gate dielectric thickness requirement of the HV devices makes fabrication integration difficult with other semiconductor devices such as the second semiconductor device 2B configured as logic device, MVMOS device or LVMOS device, which often employ a thinner gate dielectric and a thinner inter-layer dielectric (ILD). Since the ILD 50 may be shared by the first semiconductor device 2A and the second semiconductor device 2B, the ILD 50 may need to meet the requirements of both the first semiconductor device 2A and the second semiconductor device 2B. By way of example, the thickness of gate dielectric 23 of HVMOS device may have a range from about 800 angstroms to about 1200 angstroms, and the thickness of gate electrode 42 of HVMOS device ranges from about 600 angstroms to about 1200 angstroms. The thickness of the ILD 50 may not be too thicker to meet the requirement of logic device, and sometimes can be lowered to about 1300 angstroms. In such a case, the overall thickness of the gate dielectric 23 and the gate electrode 42 may exceed the thickness of the ILD 50. In such a case, the upper surface of the gate electrode 42 of HVMOS device may exceed the ILD 50, and thus uncovered by the ILD 50. This challenge gets more serious in advanced semiconductor fabrications, for example at 28 nanometer node fabrication or beyond. By virtue of the concave profile of the gate dielectric 23, the gate electrode 42 is lowered, such that the ILD 50 may cover both the gate electrode 42 of the first semiconductor device 2A and the second gate electrode 74 of the second semiconductor device 2B.

The semiconductor device and the manufacturing method thereof are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4:
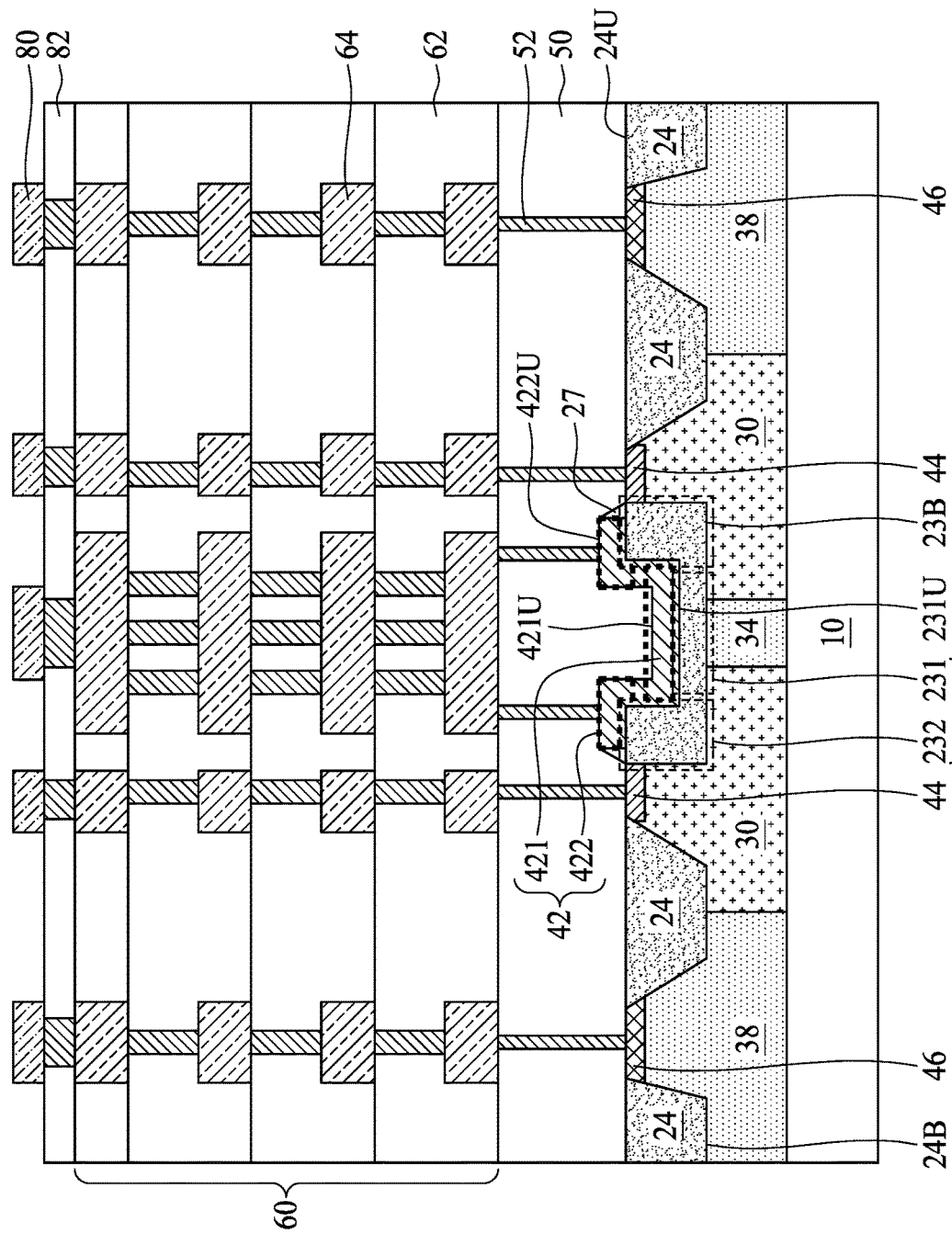
FIG. 4 is a schematic view of a semiconductor device according to some embodiments of the present disclosure.

FIG. 4 is a schematic view of a semiconductor device according to some embodiments of the present disclosure. As shown in FIG. 4, in contrast to the semiconductor device 1 of FIG. 2K, the semiconductor device 3 further includes an ILD 50 over the upper surface of the semiconductor substrate 10, and a plurality of contact vias 52 in the ILD 50. The contact vias 52 may be electrically connected to the gate electrode 42, the pair of source/drain regions 44 and/or the contact regions 46 to provide signal to or to receive signal from the gate electrode 42, the pair of source/drain regions 44 and/or the contact regions 46. The semiconductor device 3 may further include an interconnection structure 60 including one or more inter-metal dielectrics (IMDs) 62 and circuit layers 64 such as redistribution layers (RDLs). The semiconductor device 3 may further include contact pads 80 electrically connected to the gate electrode 42, the pair of source/drain regions 44 and/or the contact regions 46 through the interconnection structure 60, and a passivation layer 82 over the interconnection structure 60.

As shown in FIG. 4, at least a portion of the gate electrode 42 and the gate dielectric 23 are lower than the upper surface 10U of the semiconductor substrate 10. Accordingly, the level of the gate electrode 42 can be lowered. Hence, the ILD 50 can cover the gate electrode 42, and the contact vias 52 may be extended through the ILD 50 and electrically connected to the gate electrode 42, even when the thickness of the ILD 50 is thinner than the overall thickness of the gate dielectric 23 and the gate electrode 42.

Figure 5:
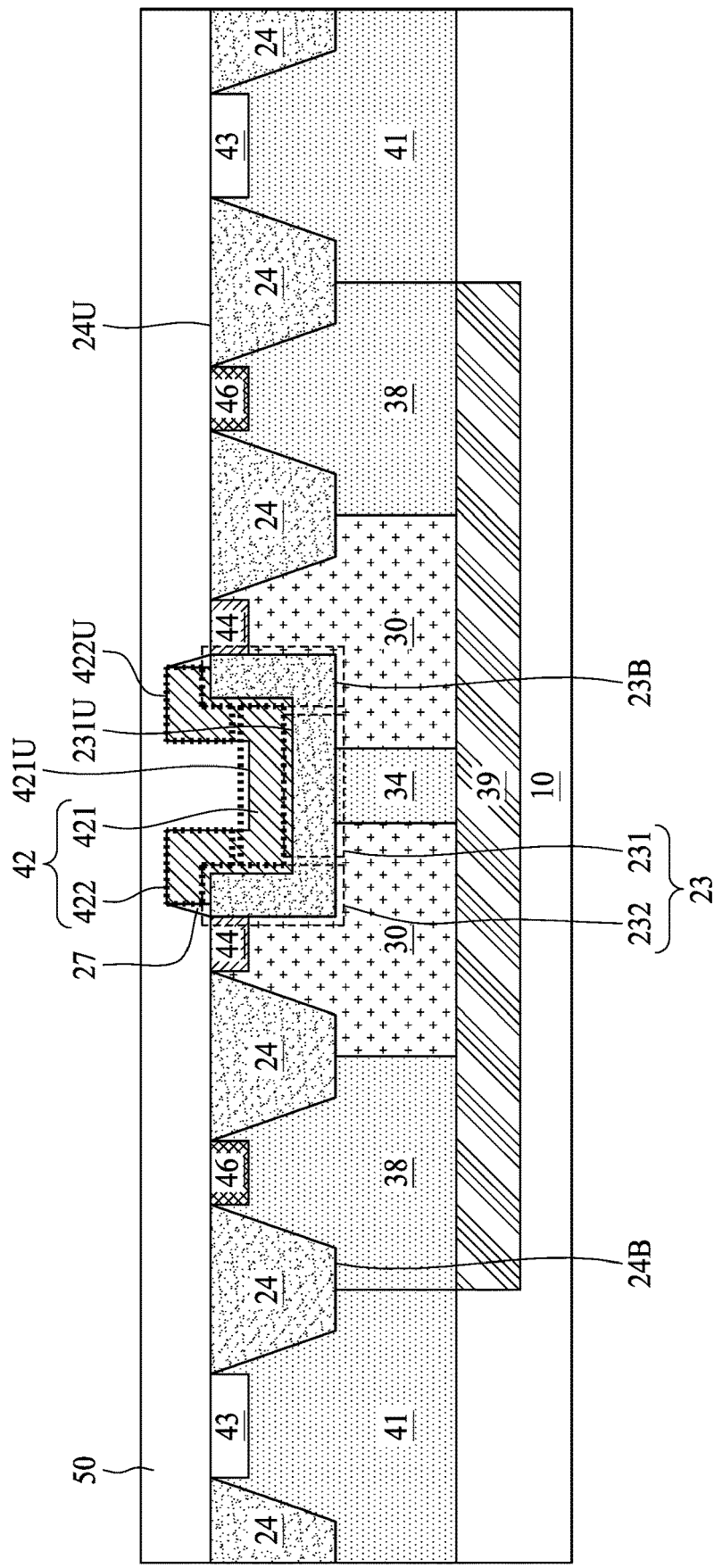
FIG. 5 is a schematic view of a semiconductor device according to some embodiments of the present disclosure.

FIG. 5 is a schematic view of a semiconductor device according to some embodiments of the present disclosure. As shown in FIG. 5, in contrast to the semiconductor device 1 of FIG. 2K, the semiconductor device 4 may be a symmetric PMOS device. The semiconductor device 4 may further includes an N type deep well region 39 formed in the P type semiconductor substrate 10 under the first well regions 30, the second well region 34 and the third well regions 38. The first well regions 30 may be P type. The second well region 34 and the third well regions 38 may be N type. In some embodiments, the contact regions 46 may be configured to provide voltage to the deep well region 39 through the third well regions 38. In some embodiments, the semiconductor device 4 may further include one or more fourth well regions 41, and one or more contact regions 43 electrically connected to the fourth well regions 41. The fourth well regions 41 and the contact regions 43 may be P type, and the doping concentration of the contact regions 43 is higher than that of the fourth well regions 41. In some embodiments, the contact regions 43 may be configured to provide voltage to the semiconductor substrate 10 through the fourth well regions 41.

Figure 6:
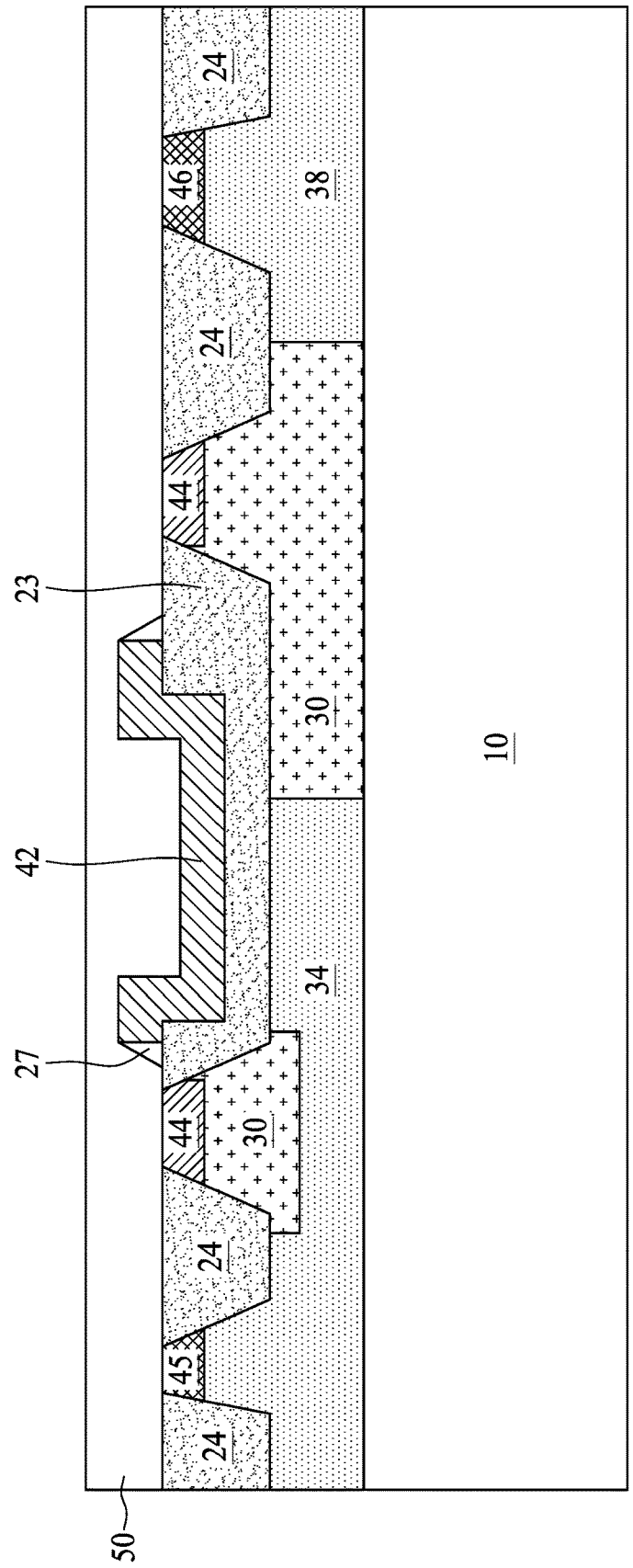
FIG. 6 is a schematic view of a semiconductor device according to some embodiments of the present disclosure.

FIG. 6 is a schematic view of a semiconductor device according to some embodiments of the present disclosure. As shown in FIG. 6, in contrast to the semiconductor device 1, the semiconductor device 5 is an asymmetric NMOS device, in which the pair of first well regions 30 are arranged asymmetrically with respect to the second well region 34. The semiconductor substrate 10 is P type. In some embodiments, the pair of first well regions 30 may have the same doping type such as N type, but different doping concentrations. For example, one of the pair of first well regions 30 is smaller and shallower than the other first well region 30, and surrounded by the second well region 34. The smaller and shallower first well region 30 may, but is not limited to, have a higher doping concentration than the other first well region 30. The second well region 34 is P type. In some embodiments, the semiconductor device 5 further includes a contact region 45 in the semiconductor substrate 10 and electrically connected to the second well region 34. The contact region 45 may have the same doping type (e.g., P type) as that of the second well region 34, but the doping concentration of the contact region 45 is higher than that of the second well region 34. The contact region 45 may be configured to provide voltage to the semiconductor substrate 10 through the second well region 34.

Figure 7:
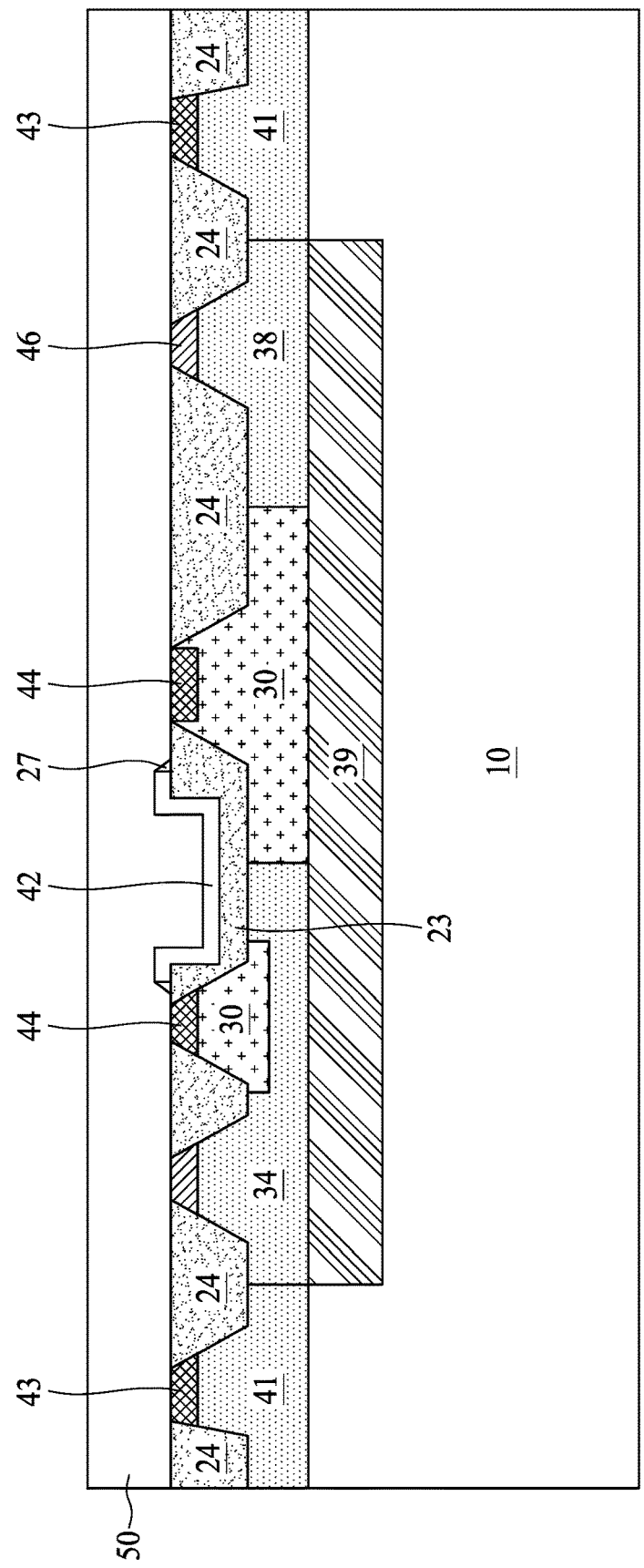
FIG. 7 is a schematic view of a semiconductor device according to some embodiments of the present disclosure.

FIG. 7 is a schematic view of a semiconductor device according to some embodiments of the present disclosure. As shown in FIG. 7, the semiconductor device 6 is an asymmetric PMOS device, in which the pair of first well regions 30 are arranged asymmetrically with respect to the second well region 34. In contrast to the semiconductor device 5, the semiconductor device 6 may further includes an N type deep well region 39 formed in the P type semiconductor substrate 10 under the first well regions 30, the second well region 34 and the third well region 38. The first well regions 30 may be P type. The second well region 34 and the third well region 38 may be N type. In some embodiments, the contact regions 46 may be configured to provide voltage to the deep well region 39 through the third well regions 38. In some embodiments, the semiconductor device 6 may further include one or more fourth well regions 41, and one or more contact regions 43 electrically connected to the fourth well regions 41. The fourth well regions 41 and the contact regions 43 may be P type, and the doping concentration of the contact regions 43 is higher than that of the fourth well regions 41. In some embodiments, the contact regions 43 may be configured to provide voltage to the semiconductor substrate 10 through the fourth well regions 41.

In some embodiments of the present disclosure, a semiconductor device such as a HVMOS device and its manufacturing method are provided. Compared to other semiconductor devices such as Medium-Voltage Metal-Oxide-Semiconductor (MVMOS) device, Low-Voltage Metal-Oxide-Semiconductor (LVMOS) device or logic MOS device, the HVMOS device has a thicker gate dielectric and thus the fabrication of HVMOS device may not be compatible with other semiconductor devices. For example, due to capacitance consideration, the for logic device may not be thick enough to cover the gate electrode of HVMOS device. The gate dielectric of the semiconductor device recessed from the isolation structure such as STI lowers the upper surface of the gate electrode while a thicker gate dielectric thickness is still achievable. Accordingly, the HVMOS device with lowered gate electrode can be integrally formed with other semiconductor devices, and shares the same ILD thickness with other semiconductor devices on another device region on the same substrate. Hence, the manufacturing operations can be simplified, and the production costs can be reduced.

In some embodiments, a semiconductor device includes a semiconductor substrate, a gate dielectric, a gate electrode, and a pair of source/drain regions. The gate dielectric is disposed in the semiconductor substrate having an upper boundary lower than an upper surface of the semiconductor substrate, and an upper surface flush with the upper surface of the semiconductor substrate. The gate electrode is disposed over the gate dielectric having a first section over the upper boundary of the gate dielectric and a second section over the upper surface of the gate dielectric. In sonic embodiments, the second section partially covers and partially exposes the upper surface of the gate dielectric. The pair of source/drain regions are disposed on opposing sides of the gate dielectric.

In some embodiments, a semiconductor device includes a semiconductor substrate, a first semiconductor device, and a second semiconductor device. The first semiconductor device includes a first gate dielectric, a first gate electrode, and a pair of first source/drain regions. The first gate dielectric is disposed in the semiconductor substrate having an upper surface flush with an upper surface of the semiconductor substrate. The first gate electrode is disposed over the first gate dielectric. In some embodiments, the first gate electrode partially covers and partially exposes the upper surface of the first gate dielectric. The pair of first source/drain regions are disposed on opposing sides of the first gate dielectric. The second semiconductor device includes a second gate dielectric, a second gate electrode, and a pair of second source/drain regions. The second gate dielectric is disposed over the semiconductor substrate having an upper surface higher than the upper surface of the semiconductor substrate. The second gate electrode is disposed over the second gate dielectric. The pair of second source/drain regions are disposed on opposing sides of the second gate dielectric.

In some embodiments, a semiconductor device includes a semiconductor substrate, a gate dielectric, a gate electrode, a pair of source/drain regions and an inter-layer dielectric. The gate dielectric is disposed in the semiconductor substrate having a concave profile that defines an upper boundary lower than an upper surface of the semiconductor substrate. The gate electrode is disposed over the gate dielectric. The pair of source/drain regions are disposed on opposing sides of the gate dielectric. The inter-layer dielectric covers the gate electrode. In some embodiments, a thickness of the inter-layer dielectric is smaller than a sum of a thickness of the gate dielectric and a thickness of the gate electrode.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a gate dielectric in the semiconductor substrate having an upper boundary lower than an upper surface of the semiconductor substrate, and an upper surface flush with the upper surface of the semiconductor substrate;
a gate electrode disposed over the gate dielectric having a first section over the upper boundary of the gate dielectric and a second section over the upper surface of the gate dielectric, wherein the second section partially covers and partially exposes the upper surface of the gate dielectric; and a pair of source/drain regions on opposing sides of the gate dielectric.

2. The semiconductor device of claim 1, further comprising a pair of well regions in the semiconductor substrate and under the pair of source/drain regions, respectively.

3. The semiconductor device of claim 2, wherein one of the pair of well regions is smaller and shallower than another one of the pair of well regions.

4. The semiconductor device of claim 2, wherein the pair of well regions have different doping concentrations.

5. The semiconductor device of claim 2, wherein a doping type of the pair of well regions is the same as that of the pair of source/drain regions.

6. The semiconductor device of claim 2, wherein doping concentrations of the pair of well regions is lower than that of the pair of source/drain regions.

7. The semiconductor device of claim 1, further comprising a deep well region formed in the semiconductor substrate.

8. The semiconductor device of claim 1, further comprising an isolation structure in the semiconductor substrate.

9. The semiconductor device of claim 8, wherein a depth of the gate dielectric is substantially the same with that of the isolation structure.

10. The semiconductor device of claim 1, wherein an upper surface of the gate electrode is lower than the upper surface of the semiconductor substrate.

11. A semiconductor device, comprising:
a semiconductor substrate;
a first semiconductor device, comprising:
    a first gate dielectric in the semiconductor substrate having an upper surface flush with an upper surface of the semiconductor substrate;
    a first gate electrode disposed over the first gate dielectric, wherein the first gate electrode partially covers and partially exposes the upper surface of the first gate dielectric; and
    a pair of first source/drain regions on opposing sides of the first gate dielectric; and
a second semiconductor device, comprising:
    a second gate dielectric over the semiconductor substrate having an upper surface higher than the upper surface of the semiconductor substrate;
    a second gate electrode disposed over the second gate dielectric; and
    a pair of second source/drain regions on opposing sides of the second gate dielectric.

12. The semiconductor device of claim 11, wherein the second gate electrode entirely covers the upper surface of the second gate dielectric.

13. The semiconductor device of claim 11, wherein the first semiconductor device further comprises a pair of first spacers on opposing sides of the first gate electrode.

14. The semiconductor device of claim 13, wherein the pair of first spacers are in contact with the upper surface of the first gate dielectric.

15. The semiconductor device of claim 11, wherein a thickness of the first gate dielectric is greater than a thickness of the second gate dielectric.

16. The semiconductor device of claim 11, wherein an upper surface of the first gate electrode is substantially flush with an upper surface of the second gate electrode.

17. A semiconductor device, comprising:
a semiconductor substrate;
a gate dielectric in the semiconductor substrate having a concave profile that defines an upper boundary lower than an upper surface of the semiconductor substrate;
a gate electrode disposed over the gate dielectric;
a pair of source/drain regions on opposing sides of the gate dielectric; and
an inter-layer dielectric covering the gate electrode, wherein a thickness of the inter-layer dielectric is smaller than a sum of a thickness of the gate dielectric and a thickness of the gate electrode.

18. The semiconductor device of claim 17, wherein an upper surface of the gate dielectric is substantially flush with a bottom surface of the inter-layer dielectric.

19. The semiconductor device of claim 17, further comprising a pair of spacers on opposing sides of the gate electrode, wherein the pair of spacers are in contact with an upper surface of the gate dielectric.

20. The semiconductor device of claim 17, wherein the gate electrode partially covers and partially exposes an upper surface of the gate dielectric.

* * * * *